United States Patent
Hosokawa

(10) Patent No.: US 6,267,851 B1
(45) Date of Patent: Jul. 31, 2001

(54) TILTED SPUTTERING TARGET WITH SHIELD TO BLOCK CONTAMINANTS

(75) Inventor: Akihiro Hosokawa, Cupertino, CA (US)

(73) Assignee: Applied Komatsu Technology, Inc., Tokyo (JP)

( * ) Notice: Subject to any disclaimer, the term of this patent is extended or adjusted under 35 U.S.C. 154(b) by 0 days.

(21) Appl. No.: 09/429,762

(22) Filed: Oct. 28, 1999

(51) Int. Cl.[7] .................................................. C23C 14/35
(52) U.S. Cl. ............................ 204/192.12; 204/298.11; 204/298.12; 204/298.17; 204/298.18
(58) Field of Search .......................... 204/192.12, 298.11, 204/298.12, 298.17, 298.18

(56) References Cited

U.S. PATENT DOCUMENTS

| 4,472,259 | * | 9/1984 | Class et al. ............................ 204/298 |
| 4,721,553 | * | 1/1988 | Saito et al. ....................... 204/192.12 |
| 4,990,229 | * | 2/1991 | Campbell et al. .............. 204/298.06 |
| 5,556,519 | * | 9/1996 | Teer ................................ 204/192.12 |
| 6,132,568 | * | 10/2000 | Jin et al. ......................... 204/192.26 |

OTHER PUBLICATIONS

English Translation of DE 40 10 495, Oct. 1991.*
DE 4010495 abstract, Oct. 1991.*

* cited by examiner

*Primary Examiner*—Nam Nguyen
*Assistant Examiner*—Steven H. VerSteeg
(74) *Attorney, Agent, or Firm*—Robert J. Stern

(57) ABSTRACT

A sputter deposition apparatus and method having a sputtering target that is tilted and a shield that intercepts particles that may fall from the target so that the particles do not deposit on the workpiece. The invention permits the workpiece to be oriented horizontally. More specifically, the sputtering target is mounted higher than the workpiece position and is oriented at an angle of 30 to 60 degrees relative to the vertical axis. The shield occupies an area such that any vertical line extending vertically downward from the front surface of the target to a point on the workpiece intersects the shield above said point.

23 Claims, 5 Drawing Sheets

FIG._1

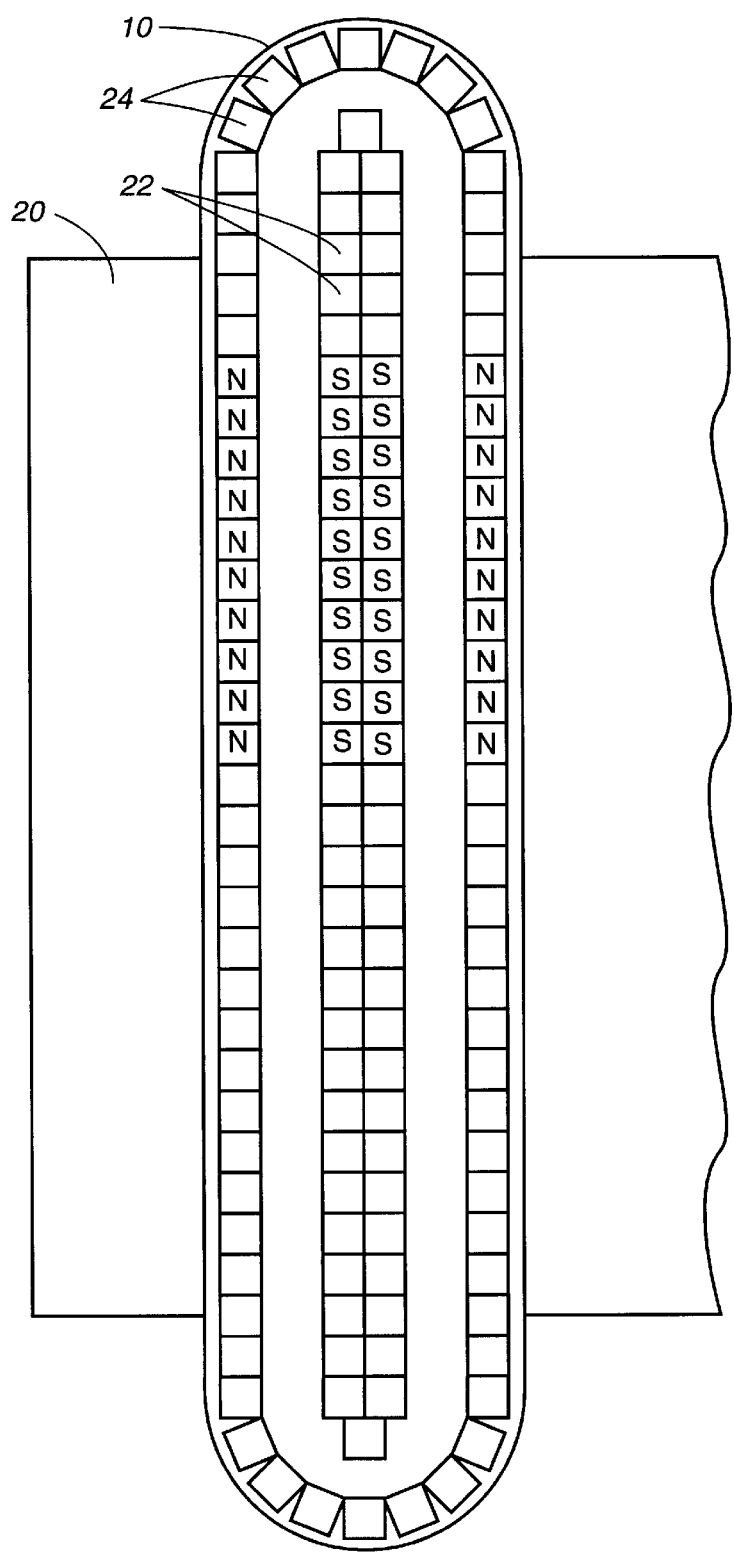
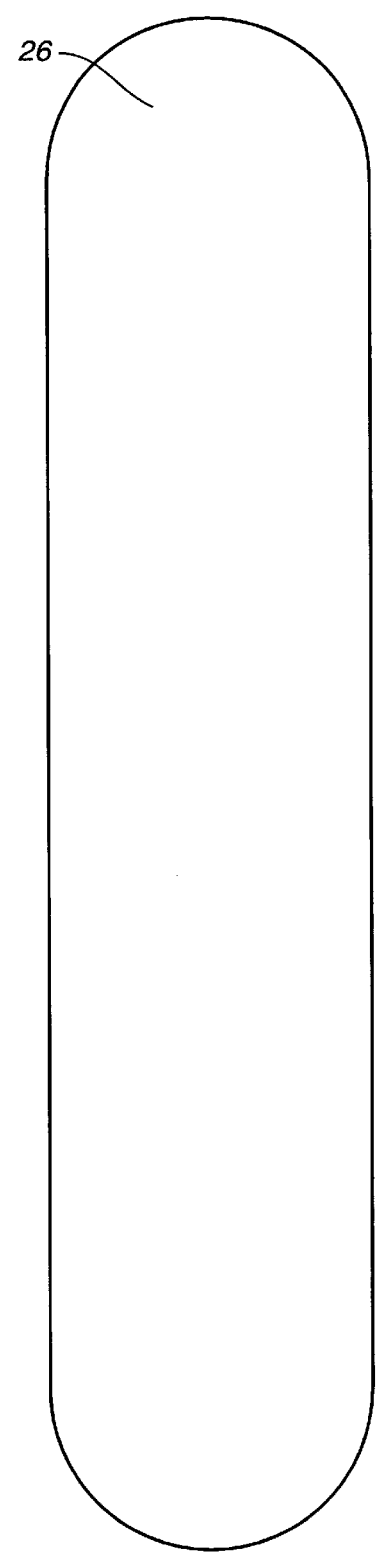
*FIG._3*  *FIG._4*

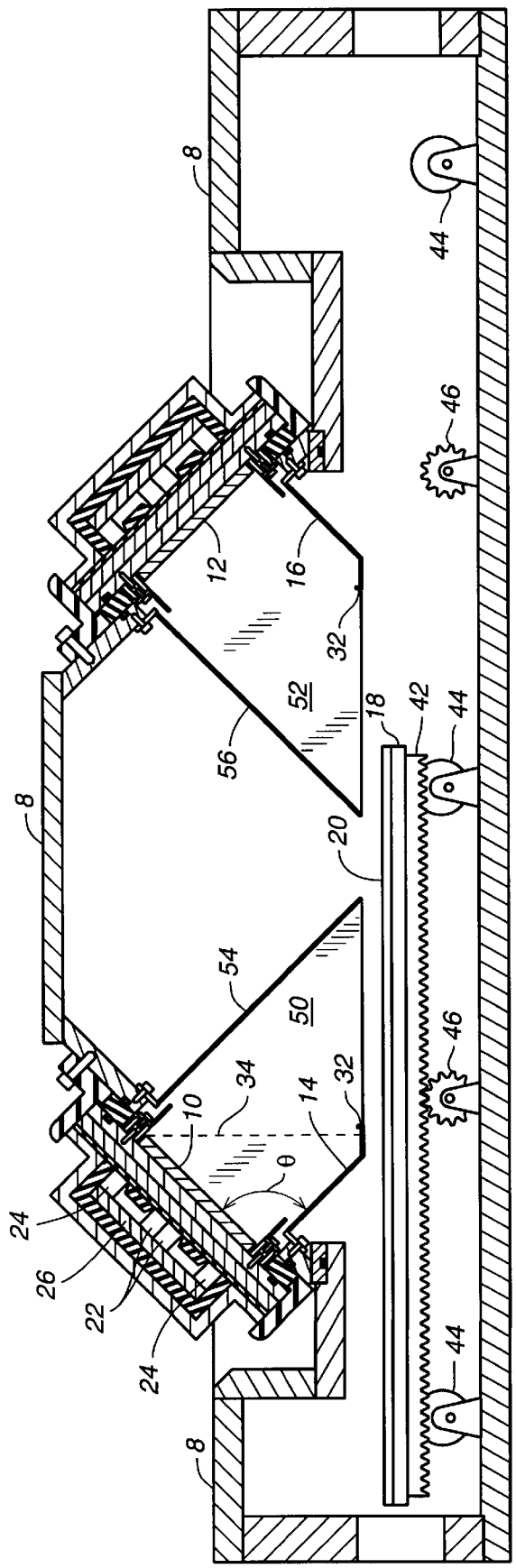
FIG._5

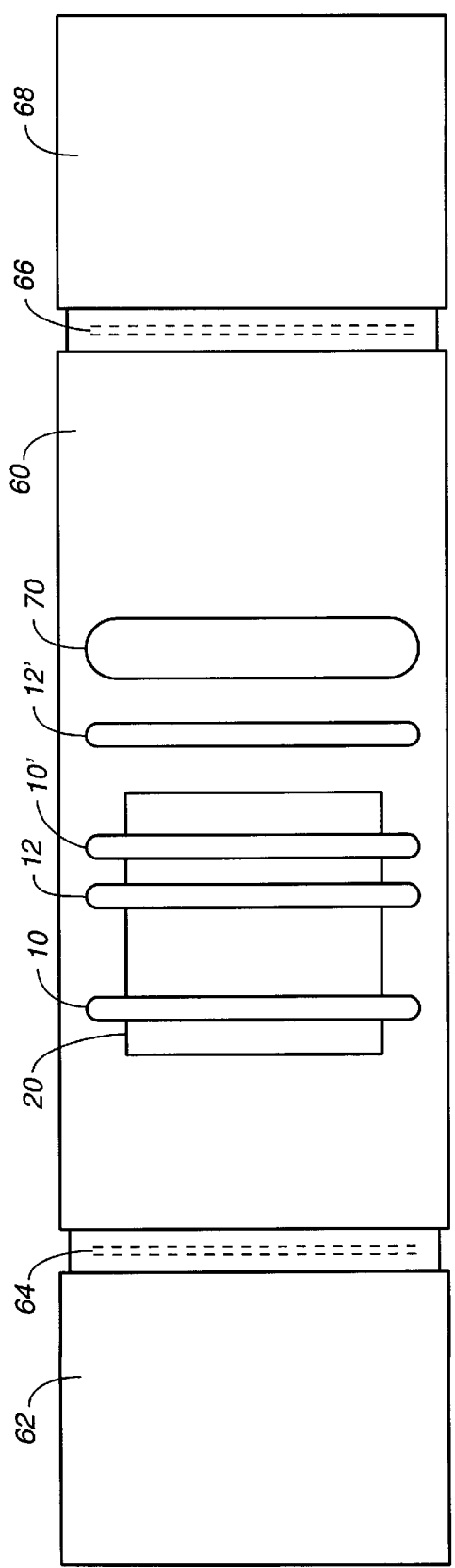
FIG._6
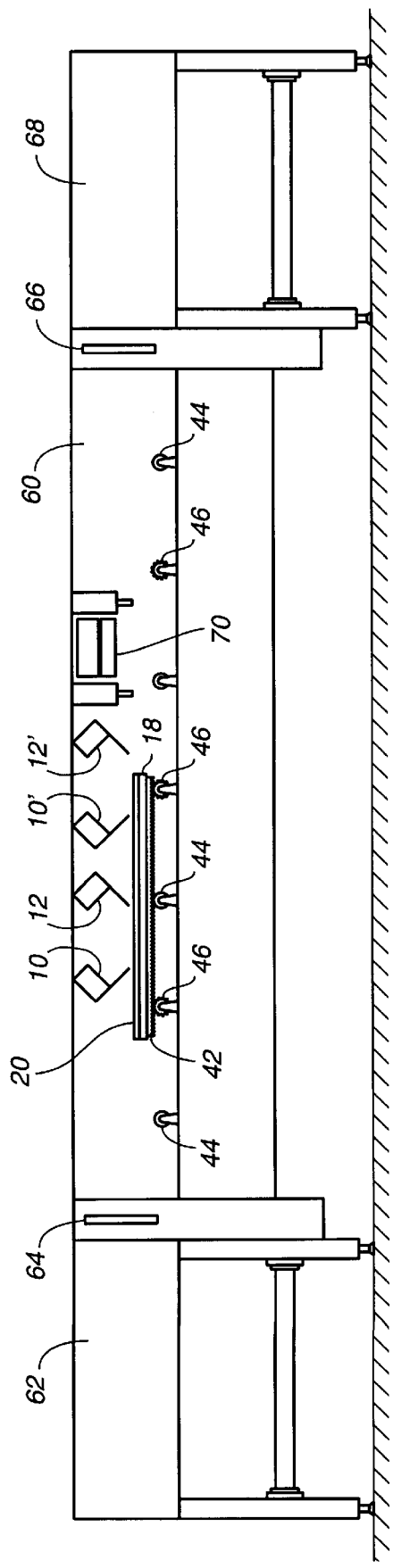
FIG._7

TILTED SPUTTERING TARGET WITH SHIELD TO BLOCK CONTAMINANTS

FIELD OF THE INVENTION

The invention relates generally to equipment for performing sputter deposition on an electronic workpiece such as a flat panel display. More specifically, the invention relates to a tilted sputtering target and shield for preventing particles of contaminants from falling from the target onto the workpiece.

BACKGROUND OF THE INVENTION

Large flat panel displays and other electronic devices generally are manufactured by a series of process steps in which successive layers of material are deposited on a workpiece, such as a glass substrate, and then patterned. Some of the deposition steps typically are performed by sputter deposition, which is deposition by sputtering material from a target.

In sputter deposition, the sputtering target and the workpiece are positioned within a vacuum chamber in which a gas having relatively heavy atoms, such as argon, is excited to a plasma state. A negative DC or alternating voltage on the target accelerates the argon ions from the plasma to bombard the target. Some of the bombardment energy is transferred to material on the surface of the target, so that molecules of target material are ejected or "sputtered" from the target. The workpiece is positioned so that a large portion of the sputtered target material deposits on the workpiece.

Some types of commonly used targets tend to produce particles of contaminants that can ruin the electronic device being manufactured if the particles are allowed to fall on the workpiece. For example, indium tin oxide (ITO) targets typically contain at least one percent impurities. As the target is sputtered, the impurities can agglomerate into particles as large as 1 mm before they fall off the target. Another type of target that tends to produce particles of contaminants is a target constructed as a matrix of tiles instead of as a single, monolithic target. Arcing in the gaps between tiles can dislodge particles of the material used to bond the tiles to a backing plate.

The problem of contaminant particles falling on the workpiece is most severe when the target and workpiece are both oriented horizontally, with the target directly above the workpiece. In that case, almost all particles that fall off the target will lodge on the workpiece.

To overcome this problem, some conventional sputter deposition chambers orient the target and the workpiece vertically, with the workpiece alongside rather than below the target. In such designs, most particles that fall off the target will harmlessly fall below the target rather than onto the workpiece. However, it is difficult to mechanically support a large glass substrate in a vertical orientation without excessively stressing and even cracking the substrate.

Therefore, a need exists for an apparatus and method for sputter depositing material on a workpiece that minimizes the deposition of contaminant particles on the substrate and that can be performed with a horizontally oriented substrate.

SUMMARY OF THE INVENTION

The invention is a sputter deposition apparatus and method comprising a tilted sputtering target and a shield that intercepts particles that may fall from the target so that the particles do not deposit on the workpiece. The invention permits the workpiece to be oriented horizontally.

More specifically, the sputtering target is mounted higher than the workpiece position and is oriented at an angle of 30 to 60 degrees relative to the vertical axis. The shield occupies an area such that any vertical line extending vertically downward from the front surface of the target to a point on the workpiece intersects the shield above said point.

Another aspect of the invention is a pair of sputtering targets oriented at an angle of 30 to 60 degrees relative to, and symmetrically relative to, a vertical plane. This symmetrical, tilted arrangement overcomes deposition non-uniformity that could occur with a single, tilted target. Each target includes two sets of magnetic poles, the first set being mounted adjacent the rear surface of the target, and the second set being mounted adjacent the perimeter of the target so as to encircle the first set. This magnet arrangement enables the magnets to be spaced close to the target so as to maximize the strength of the magnetic field adjacent the target, and thereby maximize the sputter deposition rate.

BRIEF DESCRIPTION OF THE DRAWINGS

FIG. 3 is a top plan view of the magnet structure behind one target.

FIG. 4 is a top plan view of the magnetic pole piece behind one target.

FIG. 5 is a partially schematic, sectional side view of an alternative embodiment of the chamber of FIG. 1 having reinforced shields.

FIG. 6 is a top plan view of a sputter deposition chamber having four tilted targets and one horizontal target.

FIG. 7 is an elevation view of the chamber of FIG. 6.

DETAILED DESCRIPTION OF THE PREFERRED EMBODIMENTS

Figure 1:
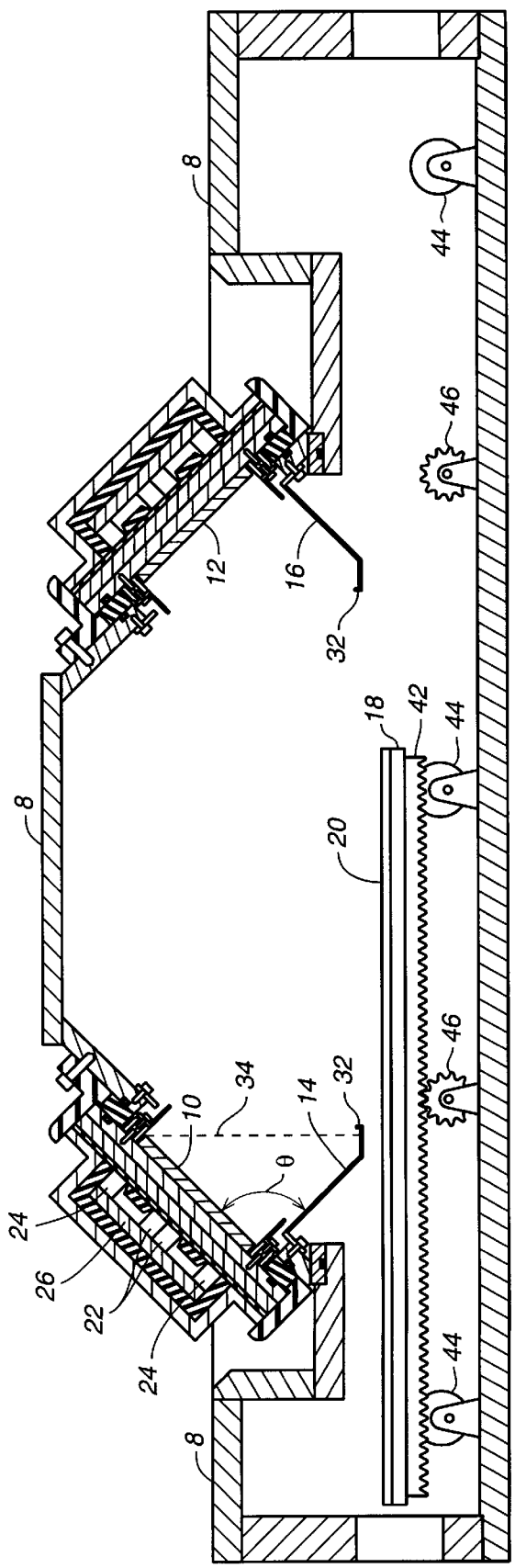
FIG. 1 is a partially schematic, sectional side view of a sputter deposition chamber having two tilted targets with shields according to the invention.
Figure 2:
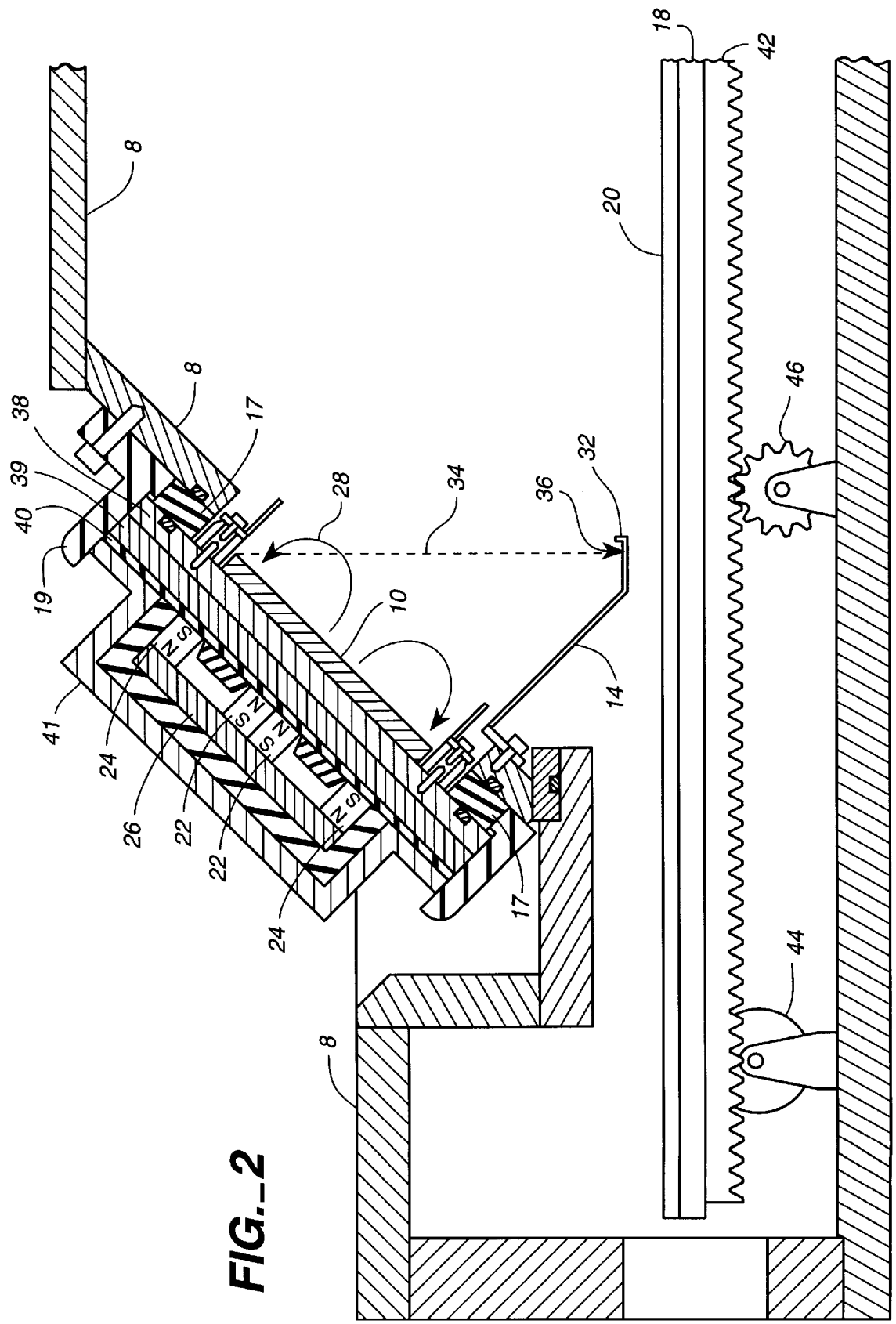
FIG. 2 is a detailed view of one of the targets and shields of FIG. 1.

FIGS. 1 and 2 shows a sputter deposition chamber 8 having two tilted sputtering targets 10, 12, where each target has a respective contaminant blocking shield 14, 16 according to the invention.

The illustrated chamber is designed to accommodate a large rectangular workpiece or substrate of the type used to fabricate electronic video displays. Such a substrate currently can be as large as 650 mm×800 mm (width×length), and even larger substrates are expected to enter widespread use in the near future.

It is expensive and difficult to construct a sputtering target and magnet as large as such a substrate. Consequently, the currently preferred embodiment of the invention employs long, narrow rectangular targets 10, 12, each of which has a length greater than that of a substrate, but a width much smaller than that of the substrate. A carrier 18 slowly moves the substrate 20 horizontally past the targets so that material sputtered from the targets covers the entire substrate. In the illustrated embodiment, each target is 10 cm wide and 1 meter long.

Any conventional transport mechanism can be installed in the chamber to slowly move the substrate past the targets. The illustrated embodiment employs a rack and pinion mechanism in which a toothed rack 42 is mounted on the bottom of the substrate carrier 18. Pinion gears 46 are mounted along the length of the chamber at spaced intervals no greater than the width of the carrier 18, so that the rack always engages at least one pinion gear. A motor, not shown, rotates the pinion gears. Freely rotating idler wheels 44 support the carrier 18 at points between the pinion gears.

FIGS. 2 and 3 show the arrangement of magnets above (i.e., behind) the targets. An array of permanent magnets produces a magnetic field having a south pole along the entire perimeter of the target and having a north pole along the long, central axis of the target. The north pole of the magnet array consists of two rows of rectangular magnets 22 along the long, central axis of the target, each magnet having its magnetic axis oriented perpendicular to the target, with the north pole adjacent the target. The south pole of the array consists of one row along the perimeter of the target of magnets 24 that are identical to the inner magnets 22, except that the south pole of each outer magnet is adjacent the target. A ferrous pole piece 26 (FIGS. 2 and 4) magnetically connects the south poles of the inner magnets to the north poles of the outer magnets so as to form a "magnetic circuit". This magnetic circuit produces a magnetic field depicted by arrows 28 in FIG. 2.

Alternatively, the north and south poles can be interchanged without affecting the performance of the apparatus.

(In FIG. 3, only a sampling of the magnets are labeled with the letters S or N, but all of the inner magnets 22 have the same magnetic orientation as the ones labeled S, and all of the outer magnets 24 have the same orientation as the ones labeled N.)

An electrical power supply, not shown, supplies a large alternating voltage or negative DC voltage, typically on the order of −600 volts, to the target 10, 12. A dielectric spacer 17 electrically insulates the target from the electrically grounded chamber wall 8, and a dielectric outer cover 19 protects personnel from accidental contact with the high voltage on the target.

The principles of operation of a magnetron sputtering system are well known. In operation, a relatively heavy gas such as argon is supplied into the vacuum chamber. A vacuum pump, not shown, maintains a very low gas pressure within the chamber, typically 1 to 5 mTorr. The magnetic field 28 tends to trap free electrons in the vicinity of the target so that they circulate around a closed, oval path parallel to the gap between the inner magnets 22 and the outer magnets 24. As in a conventional magnetron sputtering target, the two ends of each target and pole piece are semi-circular in order to provide at least a minimum turning radius for the circulating electrons.

The circulating electrons collide with and ionize the argon gas atoms. The large negative DC or alternating voltage on the target 10, 12 accelerates the argon ions toward the target. The argon ions bombard the front surface of the target so as to eject or "sputter" material from the surface of the target. Because the workpiece 20 is in front of the target, a significant portion of the sputtered target material deposits on the workpiece.

Each molecule of material sputtered from the target travels in a straight trajectory away from the target, but the trajectories of different molecules of sputtered material are distributed over a range of angles. The distribution range depends on the specific material being sputtered, but for almost all materials the trajectories of the sputtered material are concentrated in the range of plus or minus 30 degrees from a line perpendicular to the front surface of the target.

As stated above in the Background of the Invention, certain types of target material, such as indium tin oxide (ITO), commonly include organic contaminants that aggregate during sputtering of the target and ultimately flake off as particles that can fall onto the workpiece 20. In addition, a target constructed as a matrix of tiles instead of as a single, monolithic target can experience arcing in the gaps between tiles that can dislodge particles of the material used to bond the tiles to a backing plate.

To prevent such particles from contaminating the workpiece, the invention includes a shield 14, 16 below each target, and each target 10, 12 is tilted relative to the vertical axis. The shield intercepts particles falling from the target before they reach the workpiece, because the shield occupies an area such that any vertical line extending downward from the target to the workpiece position intersects the shield at a point above the workpiece position. Preferably the lower edge of the shield includes an upward-extending lip 32 that prevents particles from sliding off the lower edge of the shield.

In a conventional sputter deposition chamber having a horizontally oriented target, the workpiece must be positioned directly below the target in order to receive the material sputtered from the target. This precludes positioning a shield between the target and the workpiece to intercept contaminant particles falling off the target, because such a shield would block almost all the sputtered material. Conversely, a vertically oriented target would not permit the use of a horizontally oriented workpiece, because the material sputtered from a vertically oriented target will have horizontal trajectories, and hence would mostly fly over a horizontal workpiece.

In the present invention, the tilt of the target provides both a vertical and a horizontal component to the trajectories of the sputtered target material. The vertical component allows the substrate to be oriented horizontally without the sputtered material flying over the substrate, and the horizontal component allows the substrate to be laterally offset from the target so that a shield below the target can intercept particles of contaminants. The tilt of the target relative to the vertical axis should be in the range of 30 to 60 degrees, preferably about 45 degrees.

The two principal design parameters for the shield 14, 16 are: (1) the length by which the shield extends away from the target, and (2) the angle $\theta$ between the shield and the plane of the front surface of the target. The length of the shield should be great enough so that a vertical line 34 extending downward from the upper edge of the target toward the workpiece position intersects the shield at a point 36 above the workpiece position (see FIG. 2).

The shield in the illustrated preferred embodiment is perpendicular to the front surface of the target. Alternatively, the shield can be angled more upward or more downward so that the angle $\theta$ between the shield and the target is less than or greater than ninety degrees, respectively. Decreasing the angle between the shield and the target has the advantage of allowing the target to be mounted lower and hence closer to the workpiece. However, it increases the amount of material sputtered from the target that is blocked by the shield from reaching the workpiece. Increasing the angle has the opposite effect: it has the advantage of decreasing the amount of sputtered target material that is blocked by the shield, but it has the disadvantage of requiring the target to be mounted higher above the workpiece.

Preferably, the height of the target above the workpiece should not be so great that there is a high probability that material sputtered from the target will collide with gas atoms before reaching the workpiece. At the range of chamber pressures typically used for sputter deposition, 1 to 5 mTorr, a preferred height would be one at which the average path length of sputtered material from the target to the workpiece is 15 to 20 cm. Equivalently, the target preferably is positioned at a height above the workpiece such that a line that is perpendicular to the target and extends from the center of the target to the workpiece is 15 to 20 cm long. For a target tilted at a 45 degree angle as in the illustrated embodiment, this means the center of the target would be about 10 to 14 cm above the workpiece. Reducing the chamber pressure would increase the mean free path of sputtered target material, hence would permit a greater target height.

To minimize the distance between the target and the workpiece, the workpiece preferably should be mounted as close as possible to the shield 14, 16 while deposition is being performed. In the preferred embodiment, the carrier 18 moves the workpiece 20 along a planar, horizontal path that is only 5 mm below the lower edge of the shield.

Because the target is tilted and is laterally offset relative to the substrate, the sputtered target material generally arrives at the substrate from one side. For example, in FIG. 1 the sputtered material from the leftmost target 10 generally arrives at the substrate 20 from the left side. If the top surface of the substrate is flat, this directivity should not adversely affect the deposition of target material on the substrate. However, if the top surface of the substrate is patterned with openings that are to be filled with target material, as when fabricating metal contacts or vias, then the directivity will be undesirable because in each opening more target material will be deposited on the side wall of the opening furthest from the target. In the example of FIG. 1, each opening will have a maximum amount of material from target 10 deposited on the right side wall of the opening, and a minimum amount deposited on the left side wall.

To eliminate this directivity, the illustrated preferred embodiment employs two targets tilted in opposite directions. Specifically, the leftmost target 10 directs sputtered material toward the right, and the rightmost target 12 directs sputtered material toward the left. The two targets in combination produce uniform deposition of sputtered target material on all sides of an opening in the substrate.

As stated above, a single target 10 may suffice if the top surface of the substrate does not include deep, narrow openings to be filled with sputtered material. Therefore, the invention can be implemented with a single target 10 and a single shield 14, even though two targets are preferred.

Each shield 14, 16 preferably should be electrically isolated from the target 10, 12 in order to avoid erosion of the shield by ion bombardment. The shield can be electrically floating or, as shown in FIGS. 1, 2 and 5, it can be electrically grounded to the chamber wall 8.

To maximize the rate of sputter deposition, the distance between each of the magnets 22, 24 and the front surface of the target 10 (the surface exposed to sputtering) should be as small as possible relative to the width of the front surface of the target and relative to the gap between the magnetic poles of opposite polarity adjacent the target. In the illustrated embodiment, the latter gap is the gap between the inner magnets 22 and the outer magnets 24. Minimizing the magnet-to-target distance will maximize the strength of the magnetic field in the region of the argon ions immediately adjacent the target front surface, which will maximize the flux density of argon ions bombarding the target. Preferably the average distance between the magnets and the front surface of the target is less than 100% (more preferably, less than 50%) of the width of the front surface of the target, and is less than 200% (more preferably, less than 100%) of the average gap between the magnetic poles of opposite polarity adjacent the target. (If the target has an elongated shape as in the illustrated embodiment, its "width" and "length" are the short and long dimensions, respectively, of the front surface of the target.)

The preferred arrangement of two oppositely tilted targets, shown in FIG. 1, minimizes the distance between each of the magnets 22, 24 and the front surface of the adjacent target 10 or 12 by mounting the magnets directly behind each target. Referring to the left target 10 shown in FIG. 2, the target is bonded to a first backing plate 38 whose function is to provide mechanical strength to the target. A second backing plate 39 abutting the first backing plate includes channels through which water can be pumped to cool the target and the magnets. The backing plates should be constructed of material that is non-magnetic (i.e., non-ferrous) and that is mechanically strong, such as copper or aluminum. A dielectric sheet 40 electrically insulates the high voltage on the target and backing plates from the magnets and the outer cover 41.

In the illustrated prototype, the target is 8 mm thick, the first and second backing plates are each 10 mm thick, and dielectric sheet is 3 mm thick. The distance from each of the magnets 22, 24 to the front surface of the target 10 is the sum of these thicknesses, which equals 31 mm. Since each target is 100 mm wide, the gap between the inner and outer magnets is about 40 mm. Therefore, the 31 mm distance between each of the magnets and the front surface of the target is less than the 40 mm gap between the magnetic poles adjacent the target, and it is less than 50% of the 100 mm width of the target.

If the workpiece 20 is positioned as close to the lower edge of the shield as it is in the preferred embodiment (5 mm), the shield 14, 16 should be rigid enough that it cannot be inadvertently deflected so as to contact and thereby damage the workpiece. FIG. 5 shows an alternative embodiment in which the shield is reinforced to improve its rigidity. Specifically, each shield 14, 16 is welded to two sidewalls, which are welded to a top wall, which is bolted to the target assembly. FIG. 5 shows the left shield 14 welded to two side walls 50, and a top wall 54 welded to the two side walls. The shield 14, side walls 50, and top wall 54 in combination form a rectangular tube. Similarly, the right shield 16 is welded to two side walls 52, which are welded to a top wall 56. The side walls prevent the shield from flexing.

FIGS. 6 and 7 illustrate how several sputtering targets can be arranged within a single sputter deposition vacuum chamber 60 to deposit successive layers of target material on the workpiece 20. The carrier 18 slowly and continuously conveys the workpiece from left to right below successive sputtering targets.

Specifically, the workpiece 20 enters via entrance load lock chamber 62. Lift pins, not shown, raise the workpiece above the carrier 18 and then deposit the workpiece onto the carrier. The carrier transfers the workpiece from the entrance load lock chamber 62, through the vacuum valve 64, and into the sputter deposition vacuum chamber 60.

The carrier then moves the workpiece below the first pair of indium tin oxide (ITO) targets 10, 12 which deposit a first layer of ITO film on the substrate. The carrier continues moving the substrate so that it passes below the second pair of ITO targets 10', 12', which deposit a second layer of ITO film on the substrate. As the carrier continues moving the substrate to the right, it passes below a MoCr or Cr target 70, which deposits a MoCr or Cr layer over the previously deposited ITO layers. Finally, the carrier transfers the workpiece from the sputter deposition vacuum chamber 60, through vacuum valve 66, and into the exit load lock chamber 68.

The tilted targets and shields of the present invention are used to deposit the ITO layers because ITO targets typically produce particles of organic contaminants, as explained earlier. However, a conventional horizontal target 66 without a shield can be used for depositing the MoCr or Cr layer, because MoCr and Cr targets are readily available with a high degree of purity that does not generate particles of contaminants.

What is claimed is:

1. Apparatus for sputter deposition of material from a sputtering target onto an electronic substrate, comprising:
    a vacuum chamber;
    a first sputtering target within the vacuum chamber, wherein the first target has a front surface that faces generally downward and that is tilted at an angle in the range of 30 to 60 degrees, inclusive, relative to a vertical line;
    a workpiece support for positioning an electronic substrate at one or more workpiece positions within the vacuum chamber, wherein said one or more workpiece positions include one or more workpiece positions that are below the first target; and
    a first shield positioned within the vacuum chamber below the first target and above said workpiece positions that are below the first target, wherein the first shield occupies an area such that any line extending vertically downward from the front surface of the first target to any of said workpiece positions that are below the first target will intersect the first shield at a point above said any workpiece position.

2. Sputter deposition apparatus according to claim 1, wherein the first shield further comprises an upward extending lip at a lower end of the first shield.

3. Sputter deposition apparatus according to claim 1, wherein the workpiece support positions the substrate horizontally at said one or more workpiece positions.

4. Sputter deposition apparatus according to claim 1, further comprising:
    a second sputtering target within the sputtering chamber, wherein the second target has a front surface that faces generally downward, that faces generally toward the front surface of the first target, and that is tilted at an angle in the range of 30 to 60 degrees, inclusive, relative to a vertical line, and wherein said one or more workpiece positions include one or more workpiece positions that are below the second target; and
    a second shield positioned within the vacuum chamber below the second target and above said workpiece positions that are below the second target, wherein the second shield occupies an area such that any line extending vertically downward from the front surface of the second target to any of said workpiece positions that are below the second target will intersect the second shield at a point above said any workpiece position.

5. A method for sputter deposition of material from a sputtering target onto an electronic substrate, comprising the steps of:
    mounting within a vacuum chamber a first sputtering target having a front surface, wherein the first target is mounted so that its front surface faces generally downward and is tilted at an angle in the range of 30 to 60 degrees, inclusive, relative to a vertical line;
    positioning an electronic substrate at one or more workpiece positions within the vacuum chamber, wherein said one or more workpiece positions include one or more workpiece positions that are below the first target;
    mounting a first shield within the vacuum chamber below the first target and above said workpiece positions that are below the first target, wherein the first shield is mounted so that it occupies an area such that any line extending vertically downward from the front surface of the first target to any of said workpiece positions that are below the first target will intersect the first shield at a point above said any workpiece position; and
    sputtering material from the first target onto the electronic substrate while the electronic substrate is positioned at one of said one or more workpiece positions that are below the first target.

6. A method according to claim 5, further comprising the step of providing an upward extending lip at a lower end of the first shield.

7. A method according to claim 5, wherein the substrate positioning step further comprises positioning the substrate horizontally at said one or more workpiece positions.

8. A method according to claim 5, further comprising the steps of:
    mounting within a vacuum chamber a second sputtering target having a front surface, wherein the second target is mounted so that its front surface faces generally downward, faces generally toward the front surface of the first target, and is tilted at an angle in the range of 30 to 60 degrees, inclusive, relative to a vertical line, and wherein said one or more workpiece positions include one or more workpiece positions that are below the second target; and
    mounting a second shield within the vacuum chamber below the second target and above said workpiece positions that are below the second target, wherein the second shield is mounted so that it occupies an area such that any line extending vertically downward from the front surface of the second target to any of said workpiece positions that are below the second target will intersect the second shield at a point above said any workpiece position.

9. Apparatus for sputter deposition of material from a sputtering target onto an electronic substrate, comprising:
    a vacuum chamber;
    a first sputtering target within the vacuum chamber, wherein
        the first target has a front surface facing generally downward and a rear surface facing generally upward,
        the front surface is characterized by a width and a length such that the width is less than or equal to the length, and
        the front surface is oriented at an angle in the range of 30 to 60 degrees, inclusive, relative to a vertical line;
    a workpiece support for positioning an electronic substrate at one or more workpiece positions within the vacuum chamber, wherein said one or more workpiece positions include one or more workpiece positions that are below the first target;
    a first set of one or more magnets each having a north magnetic pole mounted adjacent the rear surface of the first target, wherein the north magnetic poles of the magnets of the first set are mounted at a collective average distance from the front surface of the first target such that said collective average distance is less than the width of the front surface of the first target; and a second set of one or more magnets each having a south magnetic pole mounted adjacent the rear surface of the first target, wherein the south magnetic poles of the magnets of the second set are mounted at a collective average distance from the front surface of the first target such that said collective average distance is less than the width of the front surface of the first target;

wherein the first and second sets of magnets collectively produce a magnetic field at the front surface of the first target having a magnitude substantially greater than any other magnetic field at the front surface.

10. Sputter deposition apparatus according to claim 9, wherein:

the magnets of the first set are mounted so that the collective average distance between the north magnetic poles and the front surface of the first target is less than half the width of the front surface of the first target; and the magnets of the second set are mounted so that the collective average distance between the south magnetic poles and the front surface of the first target is less than half the width of the front surface of the first target.

11. Sputter deposition apparatus according to claim 9, wherein the workpiece support positions the substrate horizontally at said one or more workpiece positions.

12. Sputter deposition apparatus according to claim 9, further comprising:

a second sputtering target within the vacuum chamber, wherein the second target has a front surface facing generally downward and facing generally toward the front surface of the first target, the second target has a rear surface facing generally upward, the front surface is characterized by a width and a length such that the width is less than or equal to the length, the front surface is oriented at an angle in the range of 30 to 60 degrees, inclusive, relative to a vertical line, and said one or more workpiece positions include one or more workpiece positions that are below the second target;

a third set of one or more magnets each having a north magnetic pole mounted adjacent the rear surface of the second target, wherein the north magnetic poles of the magnets of the third set are mounted at a collective average distance from the front surface of the second target such that said collective average distance is less than the width of the front surface of the second target; and a fourth set of one or more magnets each having a south magnetic pole mounted adjacent the rear surface of the second target, wherein the south magnetic poles of the magnets of the fourth set are mounted at a collective average distance from the front surface of the second target such that said collective average distance is less than the width of the front surface of the second target;

wherein the third and fourth sets of magnets collectively produce a magnetic field at the front surface of the second target having a magnitude substantially greater than any other magnetic field at the front surface.

13. Apparatus for sputter deposition of material from a sputtering target onto an electronic substrate, comprising:

a vacuum chamber;

a first sputtering target within the vacuum chamber, wherein the first target has a front surface facing generally downward and a rear surface facing generally upward, and the front surface is oriented at an angle in the range of 30 to 60 degrees, inclusive, relative to a vertical line;

a workpiece support for positioning an electronic substrate at one or more workpiece positions within the vacuum chamber, wherein said one or more workpiece positions include one or more workpiece positions that are below the first target;

a first set of one or more magnets each having a north magnetic pole mounted adjacent the rear surface of the first target; and a second set of one or more magnets each having a south magnetic pole mounted adjacent the rear surface of the first target;

wherein the magnets of the first and second sets are characterized by an average gap between said north magnetic poles and said south magnetic poles;

wherein said magnetic poles are mounted at a collective average distance from the front surface of the first target that is less than two times said average gap between said north magnetic poles and said south magnetic poles; and wherein the magnets collectively produce a magnetic field at the front surface of the first target having a magnitude substantially greater than any other magnetic field at the front surface.

14. Sputter deposition apparatus according to claim 13, wherein the magnets are mounted so that the collective average distance between said magnetic poles and the front surface of the first target is less than the average gap between the north magnetic poles and the south magnetic poles.

15. Sputter deposition apparatus according to claim 13, wherein the workpiece support positions the substrate horizontally at said one or more workpiece positions.

16. Sputter deposition apparatus according to claim 13, further comprising:

a second sputtering target within the vacuum chamber, wherein the second target has a front surface facing generally downward and facing generally toward the front surface of the first target, the second target has a rear surface facing generally upward, the front surface is oriented at an angle in the range of 30 to 60 degrees, inclusive, relative to a vertical line, and said one or more workpiece positions include one or more workpiece positions that are below the second target;

a third set of one or more magnets each having a north magnetic pole mounted adjacent the rear surface of the second target; and a fourth set of one or more magnets each having a south magnetic pole mounted adjacent the rear surface of the second target;

wherein the magnets of the third and fourth sets are characterized by an average gap between said north magnetic poles and said south magnetic poles;

wherein said magnetic poles of the third and fourth sets are mounted at a collective average distance from the front surface of the second target that is less than two times the average gap between the north magnetic poles of the third set and the south magnetic poles of the fourth set; and wherein the magnets collectively produce a magnetic field at the front surface of the second target having a magnitude substantially greater than any other magnetic field at the front surface of the second target.

17. A method for sputter deposition of material from a sputtering target onto an electronic substrate, comprising the steps of:

mounting a first sputtering target within a vacuum chamber, wherein
the first target has a front surface facing generally downward and a rear surface facing generally upward,
the front surface is characterized by a width and a length such that the width is less than or equal to the length, and
the front surface is oriented at an angle in the range of 30 to 60 degrees, inclusive, relative to a vertical line;

positioning an electronic substrate at one or more workpiece positions within the vacuum chamber, wherein said one or more workpiece positions include one or more workpiece positions that are below the first target;

mounting a first set of one or more magnets so that each magnet of the first set has a north magnetic pole mounted adjacent the rear surface of the first target, wherein the north magnetic poles of the magnets of the first set are mounted at a collective average distance from the front surface of the first target that is less than the width of the front surface of the first target;

mounting a second set of one or more magnets so that each magnet of the second set has a south magnetic pole mounted adjacent the rear surface of the first target, wherein the south magnetic poles of the magnets of the second set are mounted at a collective average distance from the front surface of the first target that is less than the width of the front surface of the first target; and sputtering material from the first target onto the electronic substrate while the electronic substrate is positioned at one of said one or more workpiece positions that are below the first target;

wherein the first and second sets of magnets collectively produce a magnetic field at the front surface of the first target having a magnitude substantially greater than any other magnetic field at the front surface.

18. A method according to claim 17, wherein:
the magnets of the first set are mounted so that the collective average distance between the north magnetic poles and the front surface of the first target is less than half the width of the front surface of the first target; and
the magnets of the second set are mounted so that the collective average distance between the south magnetic poles and the front surface of the first target is less than half the width of the front surface of the first target.

19. A method according to claim 17, further comprising:
mounting a second sputtering target within the vacuum chamber, wherein
the second target has a front surface facing generally downward and facing generally toward the front surface of the first target,
the second target has a rear surface facing generally upward,
the front surface is characterized by a width and a length such that the width is less than or equal to the length,
the front surface is oriented at an angle in the range of 30 to 60 degrees, inclusive, relative to a vertical line, and said one or more workpiece positions include one or more workpiece positions that are below the second target;

mounting a third set of one or more magnets so that each magnet of the third set has a north magnetic pole mounted adjacent the rear surface of the second target, wherein the north magnetic poles of the magnets of the third set are mounted at a collective average distance from the front surface of the second target that is less than the width of the front surface of the second target;

mounting a fourth set of one or more magnets so that each magnet of the fourth set has a south magnetic pole mounted adjacent the rear surface of the second target, wherein the south magnetic poles of the magnets of the fourth set are mounted at a collective average distance from the front surface of the second target that is less than the width of the front surface of the second target; and sputtering material from the second target onto the electronic substrate while the electronic substrate is positioned at one of said one or more workpiece positions that are below the second target;

wherein the third and fourth sets of magnets collectively produce a magnetic field at the front surface of the second target having a magnitude substantially greater than any other magnetic field at the front surface.

20. A method for sputter deposition of material from a sputtering target onto an electronic substrate, comprising the steps of:

mounting a first sputtering target within the vacuum chamber, wherein
the first target has a front surface facing generally downward and a rear surface facing generally upward, and
the front surface is oriented at an angle in the range of 30 to 60 degrees, inclusive, relative to a vertical line;

positioning an electronic substrate at one or more workpiece positions within the vacuum chamber, wherein said one or more workpiece positions include one or more workpiece positions that are below the first target;

mounting a first set of one or more magnets so that each magnet of the first set has a north magnetic pole mounted adjacent the rear surface of the first target;

mounting a second set of one or more magnets so that each magnet of the second set has a south magnetic pole mounted adjacent the rear surface of the first target; and sputtering material from the first target onto the electronic substrate while the electronic substrate is positioned at one of said one or more workpiece positions that are below the first target;

wherein the magnets of the first and second sets are characterized by an average gap between said north magnetic poles and said south magnetic poles;

wherein said magnetic poles are mounted at a collective average distance from the front surface of the first target such that said collective average distance is less than two times said average gap between said north magnetic poles and said south magnetic poles; and wherein the magnets collectively produce a magnetic field at the front surface of the first target having a magnitude substantially greater than any other magnetic field at the front surface.

21. A method according to claim 20, wherein the magnets are mounted so that the collective average distance between said magnetic poles and the front surface of the first target is less than the average gap between the north magnetic poles and the south magnetic poles.

22. A method according to claim 20, wherein the substrate positioning step comprises positioning the substrate horizontally at said one or more workpiece positions.

23. A method according to claim 20, further comprising the steps of:

mounting a second sputtering target within the vacuum chamber, wherein the second target has a front surface facing generally downward and facing generally toward the front surface of the first target, the second target has a rear surface facing generally upward, the front surface is oriented at an angle in the range of 30 to 60 degrees, inclusive, relative to a vertical line, and said one or more workpiece positions include one or more workpiece positions that are below the second target;

mounting a third set of one or more magnets so that each magnet of the third set has a north magnetic pole mounted adjacent the rear surface of the second target;

mounting a fourth set of one or more magnets so that each magnet of the fourth set has a south magnetic pole mounted adjacent the rear surface of the second target; and sputtering material from the second target onto the electronic substrate while the electronic substrate is positioned at one of said one or more workpiece positions that are below the second target;

wherein the magnets of the first and second sets are characterized by an average gap between said north magnetic poles and said south magnetic poles;

wherein said magnetic poles of the third and fourth sets are mounted at a collective average distance from the front surface of the second target that is less than two times said average gap between said north magnetic poles of the third set and said south magnetic poles of the fourth set; and wherein the magnets collectively produce a magnetic field at the front surface of the second target having a magnitude substantially greater than any other magnetic field at the front surface of the second target.

* * * * *